(12) United States Patent
Lee et al.

(10) Patent No.: US 10,573,702 B2
(45) Date of Patent: Feb. 25, 2020

(54) ORGANIC LIGHT EMITTING DISPLAY DEVICE AND METHOD OF MANUFACTURING THE SAME

(71) Applicant: Samsung Display Co., Ltd., Yongin-si, Gyeonggi-Do (KR)

(72) Inventors: Jongwon Lee, Seongnam-si (KR); Jongwoo Park, Seongnam-si (KR); Donggi Ahn, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/006,235

(22) Filed: Jun. 12, 2018

(65) Prior Publication Data

US 2019/0172885 A1 Jun. 6, 2019

(30) Foreign Application Priority Data

Dec. 6, 2017 (KR) ........................ 10-2017-0166356

(51) Int. Cl.
*H01L 21/00* (2006.01)
*H01L 27/32* (2006.01)
(Continued)

(52) U.S. Cl.
CPC ...... *H01L 27/3272* (2013.01); *H01L 27/3232* (2013.01); *H01L 27/3246* (2013.01);
(Continued)

(58) Field of Classification Search
CPC ............. H01L 27/3272; H01L 27/3232; H01L 27/3246; H01L 27/3258; H01L 51/5253; H01L 51/56
See application file for complete search history.

(56) References Cited

U.S. PATENT DOCUMENTS 8,860,027 B2 * 10/2014 Chung ................ H01L 27/3211
257/59
2011/0114957 A1 * 5/2011 Kim ..................... H01L 27/3272
257/59
(Continued)

FOREIGN PATENT DOCUMENTS

KR 10-2010-0073654 A 7/2010
KR 10-2012-0095197 A 8/2012
KR 10-2016-0014873 A 2/2016

*Primary Examiner* — Victor A Mandala
*Assistant Examiner* — Colleen E Snow
(74) *Attorney, Agent, or Firm* — Kile Park Reed & Houtteman PLLC

(57) ABSTRACT

An organic light emitting display device may include a substrate including a display area and a non-display area; a thin film transistor on the substrate in the display area; a planarization layer covering the thin film transistor; a first electrode on the planarization layer in the display area and connected to the thin film transistor; a pixel defining layer covering the first electrode and including a first opening that exposes a portion of the first electrode to define an emission area; a first light blocking layer on the pixel defining layer and including a photochromic material, a color of the first light blocking layer being reversibly changed by ultraviolet light; an organic light emitting layer on the first electrode; and a second electrode on the organic light emitting layer.

18 Claims, 13 Drawing Sheets

(51) Int. Cl.
*H01L 51/52* (2006.01)
*H01L 51/56* (2006.01)
*G02B 5/23* (2006.01)

(52) U.S. Cl.
CPC ...... *H01L 27/3258* (2013.01); *H01L 51/5253* (2013.01); *H01L 51/56* (2013.01); *G02B 5/23* (2013.01); *H01L 51/5284* (2013.01); *H01L 2227/323* (2013.01)

(56) References Cited

U.S. PATENT DOCUMENTS

| | | | |
|---|---|---|---|
| 2012/0211754 A1* | 8/2012 | Park | H01L 27/1225 257/59 |
| 2015/0048316 A1* | 2/2015 | Choi | H01L 51/5284 257/40 |

* cited by examiner

ORGANIC LIGHT EMITTING DISPLAY DEVICE AND METHOD OF MANUFACTURING THE SAME

CROSS-REFERENCE TO RELATED APPLICATION

Korean Patent Application No. 10-2017-0166356, filed on Dec. 6, 2017 in the Korean Intellectual Property Office (KIPO), and entitled: "Organic Light Emitting Display Device and Method of Manufacturing the Same," is incorporated by reference herein in its entirety.

BACKGROUND

1. Field

Embodiments relate to a display device. More particularly, embodiments relate to an organic light emitting display device including a light blocking layer and a method of manufacturing the organic light emitting display device.

2. Description of the Related Art

An organic light emitting display device may have an organic light emitting element including a hole injection layer, an electron injection layer, and an organic light emitting layer formed therebetween. In the organic light emitting display device, light may be generated as excitons, which are the combination of holes injected from the hole injection layer and electrons injected from the electron injection layer, fall from an excited state to a ground state. The organic light emitting display device may omit a separate light source to generate light, and thus, the organic light emitting display device may have relatively small thickness and light weight as well as relatively low power consumption. Furthermore, the organic light emitting display device may have relatively a wide viewing angle, high contrast and high response speed, etc.

SUMMARY

Embodiments are directed to an organic light emitting display device including a substrate including a display area and a non-display area, a thin film transistor on the substrate in the display area, a planarization layer covering the thin film transistor, a first electrode on the planarization layer in the display area, the first electrode being connected to the thin film transistor, a pixel defining layer covering the first electrode, the pixel defining layer including a first opening that exposes a portion of the first electrode to define an emission area, a first light blocking layer on the pixel defining layer, the first light blocking layer including a photochromic material, a color of the first light blocking layer being reversibly changeable upon exposure to ultraviolet light, an organic light emitting layer on the first electrode, and a second electrode on the organic light emitting layer.

The pixel defining layer and the first light blocking layer may be located over the substrate in both the display area and the non-display area.

The photochromic material may include at least one of spiropyran, a spironaphthoxazine dye, a diarylethene derivative, dihydropyridine, a furyl fulgide derivative, and an azobenzene derivative.

The first light blocking layer may become opaque upon exposure to ultraviolet light.

The first light blocking layer may include a second opening corresponding to the first opening.

The organic light emitting display device may further include an encapsulation member on the second electrode.

The organic light emitting display device may further include a second light blocking layer between the planarization layer and the pixel defining layer. A color of the second light blocking layer may be reversibly changeable upon exposure to ultraviolet light.

The second light blocking layer may include a same material as the first light blocking layer.

The second light blocking layer may become opaque upon exposure to ultraviolet light.

The organic light emitting display device may further include a spacer between the pixel defining layer and the first light blocking layer. The spacer may include a second opening that has a width greater than a width of the first opening.

The first light blocking layer may include a third opening corresponding to the second opening.

Embodiments are also directed to a method of manufacturing an organic light emitting display device including preparing a substrate including a display area and a non-display area, forming a thin film transistor on the substrate in the display area, forming a planarization layer covering the thin film transistor on the substrate, forming a first electrode connected to the thin film transistor on the planarization layer in the display area, forming a pixel defining layer covering the first electrode and including a first opening that exposes a portion of the first electrode to define an emission area on the planarization layer, forming a first light blocking layer including a photochromic material on the pixel defining layer, a color of the first light blocking layer being reversibly changeable upon exposure to ultraviolet light, forming an organic light emitting layer on the first electrode and forming a second electrode on the organic light emitting layer.

The pixel defining layer and the first light blocking layer may be formed over the substrate in both the display area and the non-display area.

Forming the pixel defining layer and forming the first light blocking layer may include sequentially forming a preliminary pixel defining layer and a preliminary first light blocking layer covering the first electrode on the planarization layer and simultaneously forming the first opening of the pixel defining layer and a second opening of the first light blocking layer corresponding to the first opening by photolithography.

Forming the pixel defining layer may include forming a preliminary pixel defining layer covering the first electrode on the planarization layer and forming the first opening of the pixel defining layer by photolithography. Forming the first light blocking layer may include forming the first light blocking layer to include a second opening corresponding to the first opening.

The method may further include forming a second light blocking layer between the planarization layer and the pixel defining layer, a color of the second light blocking layer being reversibly changeable upon exposure to ultraviolet light.

Forming the planarization layer and forming the second light blocking layer may include sequentially forming the planarization layer and the second light blocking layer to cover the thin film transistor on the substrate and forming a contact hole exposing a portion of the thin film transistor in the planarization layer and in the second light blocking layer by photolithography.

The method may further include forming an encapsulation member on the second electrode.

The method may further include forming a spacer between the pixel defining layer and the first light blocking layer, the spacer having a width less than a width of the pixel defining layer.

Forming the pixel defining layer, forming the spacer, and forming the first light blocking layer may include sequentially forming a preliminary pixel defining layer and a preliminary first light blocking layer covering the first electrode on the planarization layer and simultaneously forming the first opening of the pixel defining layer, a second opening of the spacer, and a third opening of the first light blocking layer by photolithography, the second opening having a width greater than that of the first opening, and the third opening corresponding to the second opening.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
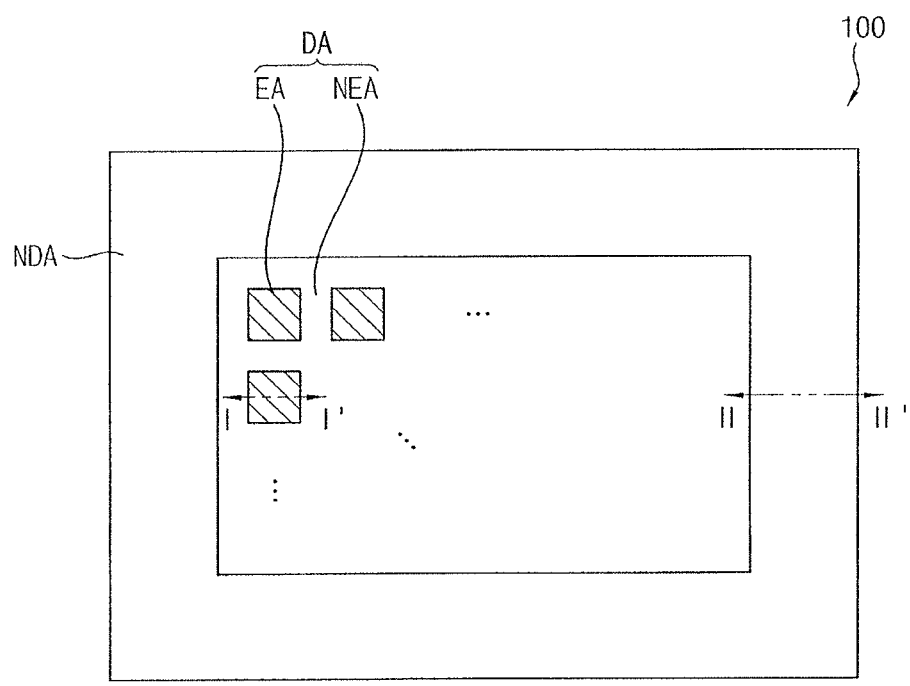
FIG. 1 illustrates a plan view of an organic light emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

Hereinafter, a planar structure of an organic light emitting display device according to an embodiment will be described with reference to FIG. 1

FIG. 1 illustrates a plan view of an organic light emitting display device according to an embodiment.

Referring to FIG. 1, an organic light emitting display device 100 according to an embodiment may include a display area DA and a non-display area NDA. A plurality of pixels may be disposed in the display area DA. The display area DA may display an image. The non-display area NDA may be located at at least one side of the display area DA. Driving circuits for applying signals to the display area DA may be disposed in the non-display area NDA to display the image.

The display area DA may include a plurality of emission areas EA and a non-emission area NEA. Each of the emission areas EA may correspond to one of the pixels. The emission areas EA may be arranged as a matrix from. Each of the emission areas EA may include an organic light emitting element, thereby emitting light. The non-emission area NEA may surround the emission areas EA. Light is not emitted from the non-emission area NEA.

Hereinafter, a cross-sectional structure of an organic light emitting display device according to an embodiment will be described with reference to FIG. 2.

Figure 2:
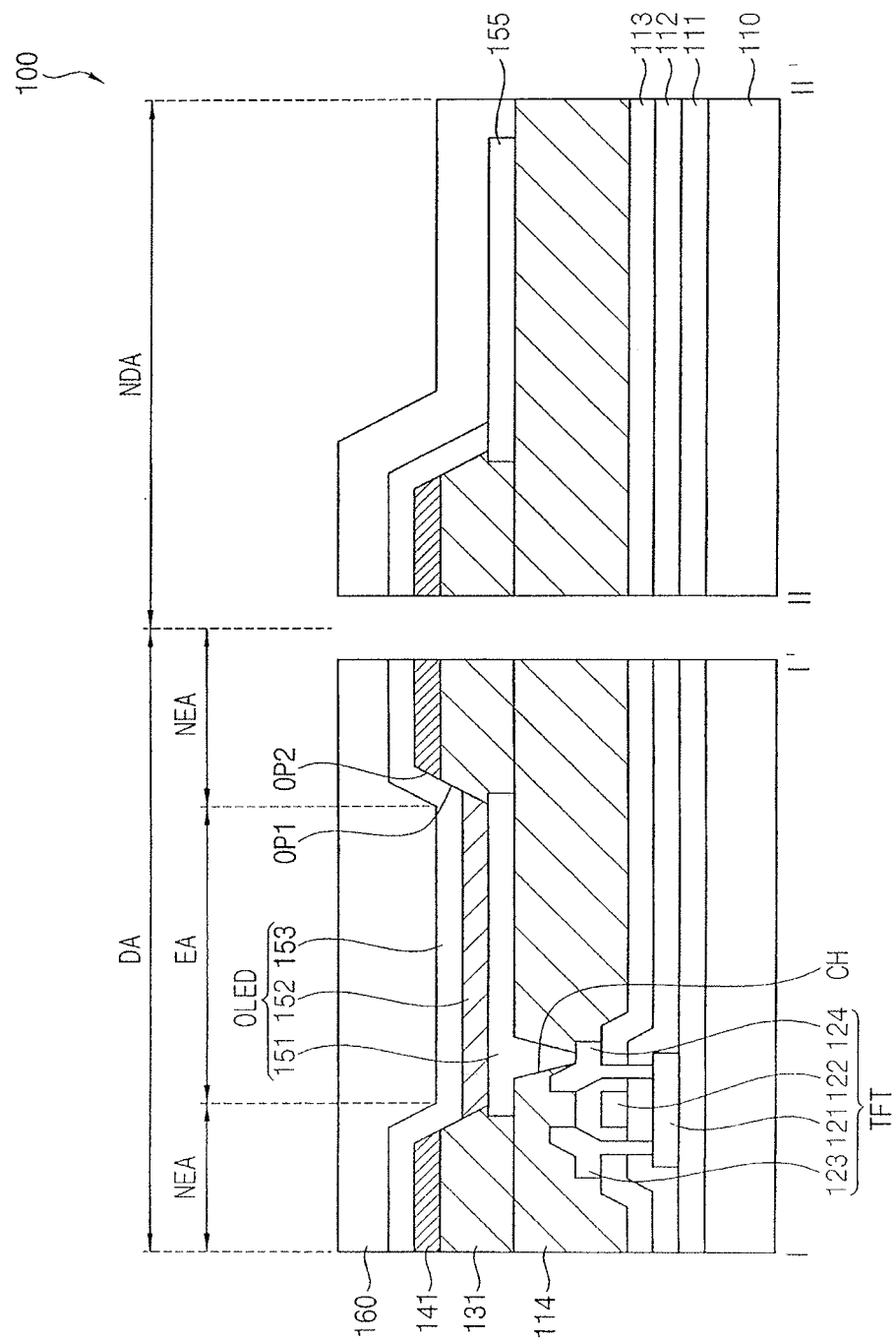
FIG. 2 illustrates a cross-sectional view of an organic light emitting display device according to an embodiment.

FIG. 2 is a cross-sectional view illustrating an organic light emitting display device according to an embodiment. For example, FIG. 2 may be a cross-sectional view taken along a line I-I' and a line II-II' in FIG. 1.

Referring to FIG. 2, the organic light emitting display device 100 according to an embodiment may include a substrate 110, a buffer layer 111, a thin film transistor TFT, a gate insulation layer 112, an insulation interlayer 113, a planarization layer 114, an organic light emitting element OLED, a peripheral electrode 155, a pixel defining layer 131, a first light blocking layer 141, and an encapsulation member 160. The thin film transistor TFT may include an active pattern 121, a gate electrode 122, a source electrode 123, and a drain electrode 124. The organic light emitting element OLED may include a first electrode 151, a light emitting layer 152, and a second electrode 153.

The substrate 110 may include the display area DA and the non-display area NDA. The substrate 110 may be formed of glass, quartz, plastic, or the like.

The buffer layer 111 may be disposed on the substrate 110. The buffer layer 111 may prevent impurities from permeating through the substrate 110. Further, the buffer layer 111 may provide a planarized upper surface over the substrate 110. In some implementations, the buffer layer 111 may be omitted.

The thin film transistor TFT may be disposed on the buffer layer 111 in the display area DA. The thin film transistor TFT may apply electric current to the organic light emitting element OLED. In some implementations, the organic light emitting display device 100 may include a thin film transistor having a top-gate structure. In some implementations, the organic light emitting display device 100 may include a thin film transistor having a bottom-gate structure.

The active pattern 121 may be disposed on the buffer layer 111. The active pattern 121 may include amorphous silicon, polycrystalline silicon, or the like. In some implementations, the active pattern 121 may include an oxide semiconductor.

The gate insulation layer 112 may be disposed on the buffer layer 111 and may cover the active pattern 121. The gate insulation layer 112 may insulate the gate electrode 122 from the active pattern 121. The gate insulation layer 112 may include silicon nitride (SiNx), silicon oxide (SiOx), or the like.

The gate electrode 122 may be disposed on the gate insulation layer 112. The gate electrode 122 may overlap the active pattern 121. The gate electrode 122 may include gold (Au), silver (Ag), copper (Cu), nickel (Ni), platinum (Pt), palladium (Pd), aluminum (Al), molybdenum (Mo), or titanium (Ti), as examples.

The insulation interlayer 113 covering the gate electrode 122 may be disposed on the gate insulation layer 112. The insulation interlayer 113 may insulate the source electrode 123 and the drain electrode 124 from the gate electrode 122. The insulation interlayer 113 may include silicon nitride (SiNx), silicon oxide (SiOx), or the like.

The source electrode 123 and the drain electrode 124 may be disposed on the insulation interlayer 113. The source electrode 123 and the drain electrode 124 may contact the active pattern 121. For example, the source electrode 123 and the drain electrode 124 may contact the active pattern 121 through contact holes formed in the gate insulation layer 112 and the insulation interlayer 113, respectively. The source electrode 123 and the drain electrode 124 may include Au, Ag, Cu, Ni, Pt, Pd, Al, Mo, or Ti. For example, the source electrode 123 and the drain electrode 124 may be formed as a multi-layer structure such as Mo/Al/Mo or Ti/Al/Ti.

The planarization layer 114 may be disposed on the insulation interlayer 113 and may cover the thin film transistor TFT. The planarization layer 114 may provide a planarized surface over the insulation interlayer 113 and TFT. The planarization layer 114 may include a photosensitive organic material. For example, the planarization layer 114 may be formed of photoresist, polyacrylate-based resin, polyimide-based resin, siloxane-based resin, acryl-based resin, epoxy-based resin, or the like.

The organic light emitting element OLED may be disposed on the planarization layer 114 in the display area DA. The organic light emitting element OLED may emit light based on the electric current applied from the thin film transistor TFT. It is exemplified that the organic light emitting display device 100 according to the embodiment includes an organic light emitting element having a front-sided emission structure. However, in some implementations, the organic light emitting display device 100 may include an organic light emitting element having a rear-sided emission structure or a double-sided emission structure.

The first electrode 151 may be disposed on the planarization layer 114 in the display area DA. The first electrode 151 may be patterned per each pixel. The first electrode 151 may contact the drain electrode 124. For example, the first electrode 151 may contact the drain electrode 124 through a contact hole CH formed in the planarization layer 114. The first electrode 151 may be a reflective electrode. The first electrode 151 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), or the like, and a transmitting layer formed of indium tin oxide (ITO), indium zinc oxide (IZO), zinc oxide (ZnO), indium oxide ($In_2O_3$), or the like. For example, the first electrode 151 may be formed as a multi-layer structure such as ITO/Ag/ITO.

The peripheral electrode 155 may be disposed on the planarization layer 114 in the non-display area NDA. The peripheral electrode 155 may be connected to an end of the second electrode 153 and may apply a common voltage to the second electrode 153. The peripheral electrode 155 may include a material that is substantially the same as that of the first electrode 151.

The pixel defining layer 131 may be disposed on the planarization layer 114 and may cover the first electrode 151 and the peripheral electrode 155. The pixel defining layer 131 may include a first opening OP1 that defines the emission area EA by exposing a portion of the first electrode 151. The pixel defining layer 131 may include a photosensitive organic material. For example, the pixel defining layer 131 may be formed of a photoresist, a polyacrylate-based resin, a polyimide-based resin, a siloxane-based resin, an acryl-based resin, an epoxy-based resin, or the like.

If external light were to be incident onto the pixel defining layer 131 and/or the planarization layer 114, the pixel defining layer 131 and/or the planarization layer 114 might generate outgas. If the outgas were to be transferred to the organic light emitting element OLED, there is a possibility that organic light emitting element OLED could be degraded.

In order to prevent the external light from being incident onto the pixel defining layer 131 and/or onto the planarization layer 114, the first light blocking layer 141 may be disposed on the pixel defining layer 131. A color of the first light blocking layer 141 may be reversibly changed by exposure to ultraviolet light.

The first light blocking layer 141 may include a photochromic material. The photochromic material may include an organic material such as spiropyran, a spironaphthoxazine dye, a diarylethene derivative, dihydropyridine, a furyl fulgide derivative, or an azobenzene derivative.

The organic molecular structure of the photochromic material may be changed depending on whether or not ultraviolet light is absorbed. The color of the photochromic material may be changed depending on the change of the organic molecular structure. Accordingly, the transmittance of the first light blocking layer 141 including the photochromic material may be changed depending on whether or not ultraviolet light is incident on the photochromic material. When ultraviolet light is not incident the photochromic material, the first light blocking layer 141 may be transparent. When ultraviolet light is incident on the photochromic material, the first light blocking layer 141 may have black color, and may become opaque. The first light blocking layer 141 may become opaque by exposure to ultraviolet light external to where ultraviolet light is incident, and the opaque first light blocking layer 141 may prevent ultraviolet light from being incident on the pixel defining layer 131 and/or the planarization layer 114. In other words, UV light incident on a portion of the first light blocking layer 141 may render an entirely of the first light blocking layer 141 opaque.

The first light blocking layer 141 may include a second opening OP2. The second opening OP2 of the first light blocking layer 141 may correspond to the first opening OP1 of the pixel defining layer 131. For example, a width of the second opening OP2 of the first light blocking layer 141 may be substantially equal to a width of the first opening OP1 of the pixel defining layer 131. When the first light blocking layer 141 includes the second opening OP2, blocking of light emitted from the organic light emitting layer 152 by the first light blocking layer 141 may be avoided.

The pixel defining layer 131 and the first light blocking layer 141 may be over the substrate 110 in both the display area DA and the non-display area NDA. When the first light blocking layer 141 is in the non-display area NDA as well as in the display area DA, visibility in an outdoor environment of the organic light emitting display device may be further improved, and outgassing from the pixel defining layer 131 disposed in the non-display area NDA may be prevented.

The organic light emitting layer 152 may be disposed on the first electrode 151. The organic light emitting layer 152 may be disposed inside the first opening OP1 of the pixel defining layer 131.

The second electrode 153 may be disposed on the organic light emitting layer 152. The second electrode 153 may be commonly provided for a plurality of pixels. The second electrode 153 may be a transmitting electrode. For example, the second electrode 153 may be formed of a metal, a metal alloy, a metallic nitride, a transparent metallic oxide, a transparent conductive material, or the like.

A hole injection layer (HIL) and/or a hole transport layer (HTL) may be further disposed between the first electrode 151 and the organic light emitting layer 152. An electron transport layer (ETL) and/or an electron injection layer (EIL) may be further disposed between the organic light emitting layer 152 and the second electrode 153.

The encapsulation member 160 may be disposed on the second electrode 153. The encapsulation member 160 may encapsulate the organic light emitting element OLED thereby preventing oxygen, moisture, etc. from permeating into the organic light emitting element OLED from the outside. The encapsulation member 160 may include at least one inorganic layer and at least one organic layer. For example, the encapsulation member 160 may include a first inorganic layer, a second inorganic layer, and an organic layer disposed therebetween.

Hereinafter, an example of a method of manufacturing an organic light emitting display device according to an embodiment will be described with reference to FIGS. 2, 3A, and 3B.

Figure 3A:
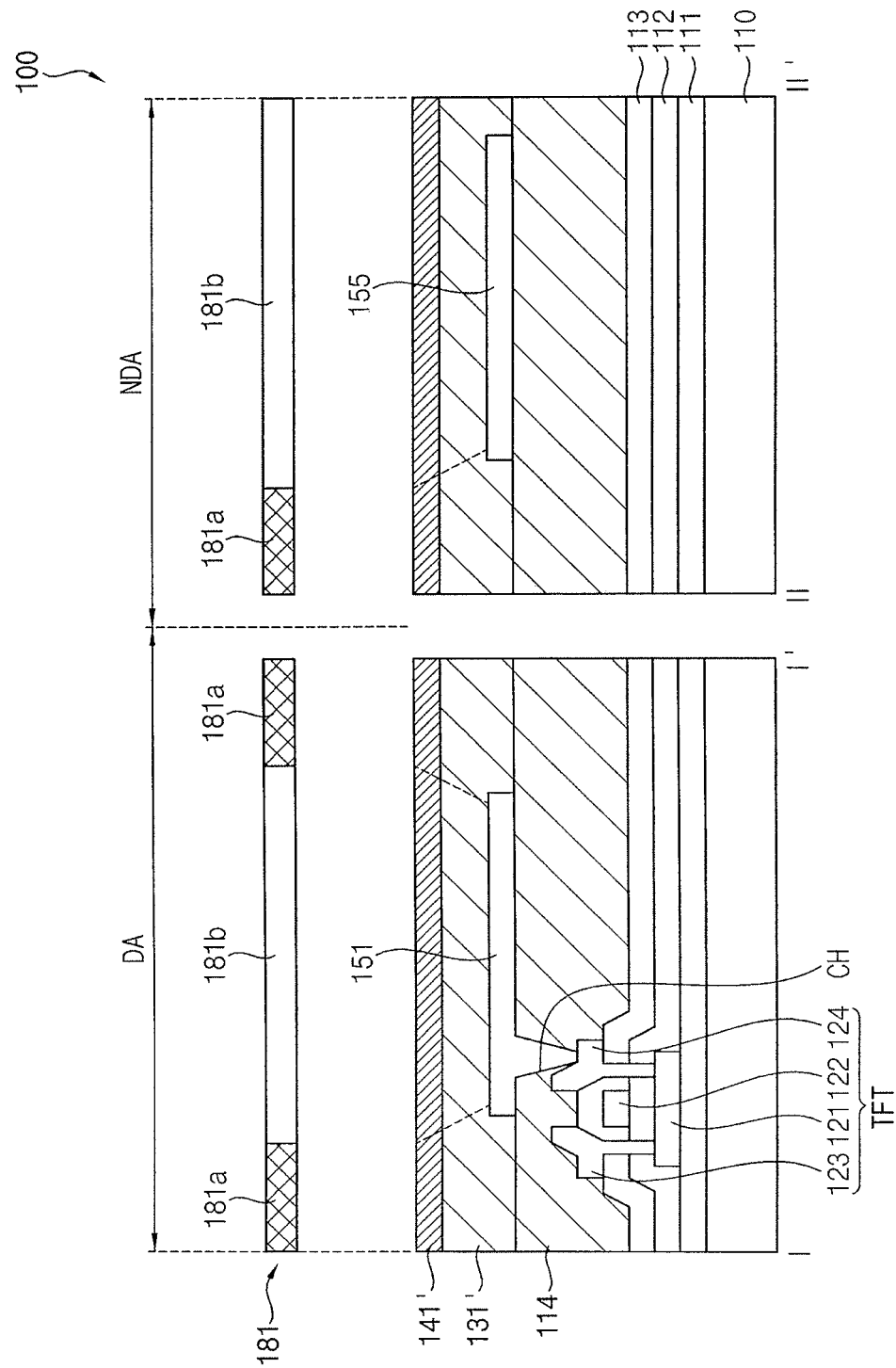
FIGS. 3A and 3B illustrate cross-sectional views of stages of an exemplary method of manufacturing the organic light emitting display device in FIG. 2.
Figure 3B:
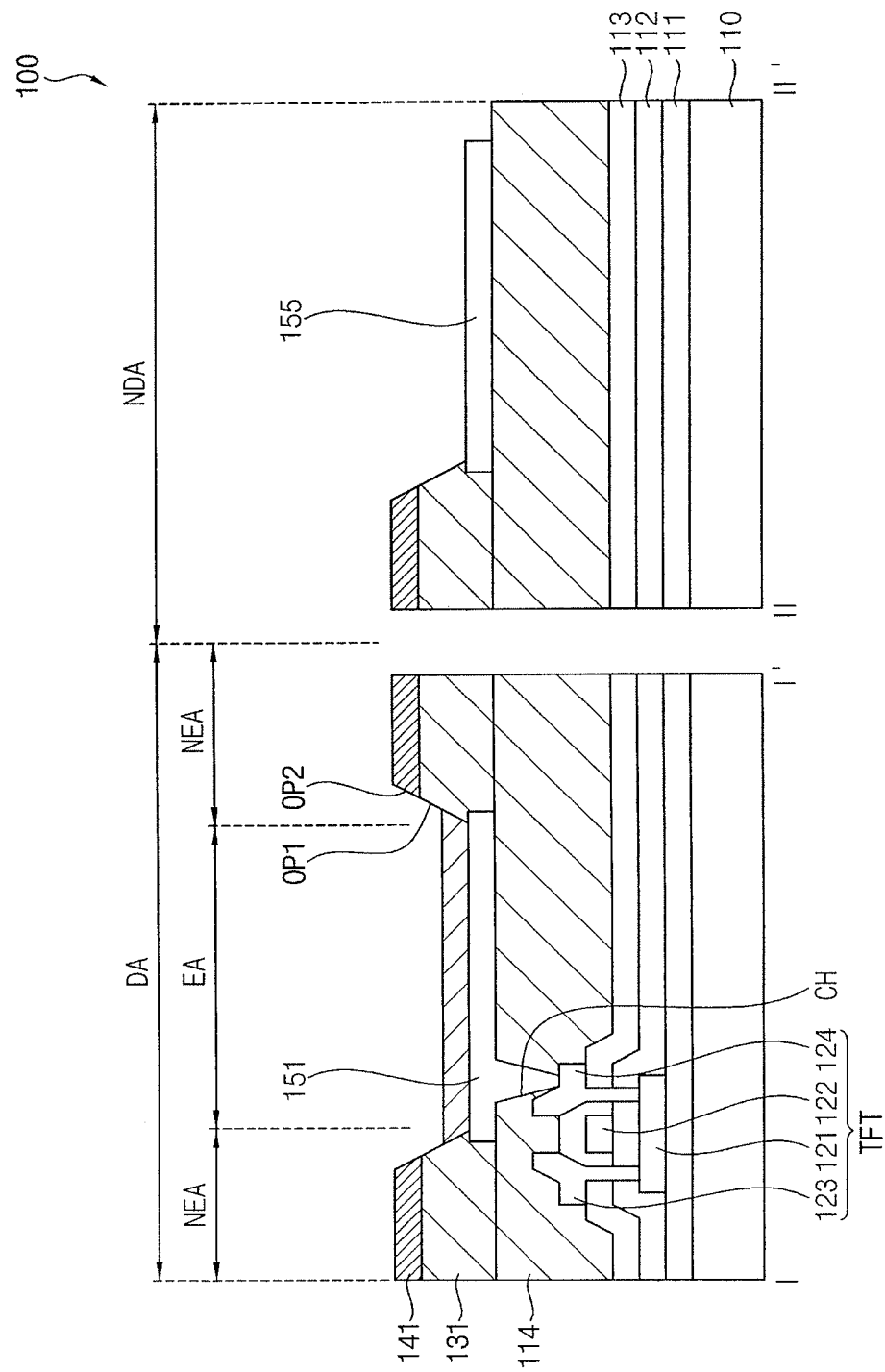

FIGS. 3A and 3B illustrate cross-sectional views of stages of an exemplary method of manufacturing the organic light emitting display device in FIG. 2.

Referring to FIG. 3A, the substrate 110 including the display area DA and the non-display area NDA may be prepared, and the thin film transistor TFT, the planarization layer 114, and the first electrode 151 may be sequentially formed on the substrate 110.

The buffer layer 111 may be formed on the substrate 110, and the active pattern 121 may be formed on the buffer layer 111 in the display area DA. The gate insulation layer 112 covering the active pattern 121 may be formed on the buffer layer 111, and the gate electrode 122 overlapping the active pattern 121 may be formed on the gate insulation layer 112. The insulation interlayer 113 covering the gate electrode 122 may be formed on the gate insulation layer 112, and contact holes respectively exposing opposite ends of the active pattern 121 may be formed in the gate insulation layer 112 and in the insulation interlayer 113. The source electrode 123 and the drain electrode 124 respectively filling the contact holes may be formed on the insulation interlayer 113.

The planarization layer 114 covering the source electrode 123 and the drain electrode 124 may be formed on the insulation interlayer 113, and the contact hole CH exposing the drain electrode 124 may be formed in the planarization layer 114. The first electrode 151 filling the contact hole CH may be formed on the planarization layer 114 in the display area DA, and the peripheral electrode 155 may be formed on the planarization layer 114 in the non-display area NDA. The first electrode 151 and the peripheral electrode 155 may be substantially simultaneously formed.

A preliminary pixel defining layer 131' covering the first electrode 151 and the peripheral electrode 155 may be formed on the planarization layer 114. The preliminary pixel defining layer 131' may be formed of a photosensitive organic material.

A preliminary first light blocking layer 141' may be formed on the preliminary pixel defining layer 131'. The preliminary first light blocking layer 141' may be formed of a photosensitive photochromic organic material.

Referring to FIGS. 3A and 3B, openings may be formed in the preliminary pixel defining layer 131' and the preliminary first light blocking layer 141' by photolithography.

First, a mask 181 may be disposed over the preliminary first light blocking layer 141'. The mask 181 may include a light blocking portion 181a and a light transmitting portion 181b. For example, a light transmittance of the light blocking portion 181a may be substantially 0%, and a light transmittance of the light transmitting portion 181b may be substantially 100%. The mask 181 may be disposed such that the light transmitting portion 181b corresponds to the first opening OP1 of the pixel defining layer 131 and the second opening OP2 of the first light blocking layer 141.

Then, light may be irradiated from top of the mask 181 to the preliminary first light blocking layer 141' to form the first opening OP1 of the pixel defining layer 131 and the second opening OP2 of the first light blocking layer 141. The first opening OP1 and the second opening OP2 may be substantially simultaneously formed. The first opening OP1 and the second opening OP2 may be simultaneously formed by one photolithography process, so that time and cost of manufacturing the display device may be reduced.

Referring to FIG. 2, the organic light emitting layer 152 and the second electrode 153 may be sequentially formed on the first electrode 151.

The organic light emitting layer 152 may be formed on the first electrode 151. The organic light emitting layer 152 may be formed inside the first opening OP1 of the pixel defining layer 131. The organic light emitting layer 152 may be deposited by printing process such as a nozzle printing, an inkjet printing, or the like. The second electrode 153 may be formed on the organic light emitting layer 152. The second electrode 153 may cover the light emitting layer 152 and the first light blocking layer 141.

The encapsulation member 160 may be formed on the second electrode 153.

Hereinafter, another example of a method of manufacturing an organic light emitting display device according to an embodiment will be described with reference to FIGS. 4A, 4B, and 4C. Description of aspects of the method of manufacturing the organic light emitting display device with reference to FIGS. 4A, 4B, and 4C that are substantially the same as or similar to those of the method of manufacturing the organic light emitting display device with reference to FIGS. 2, 3A, and 3B, will not be repeated.

Figure 4A:
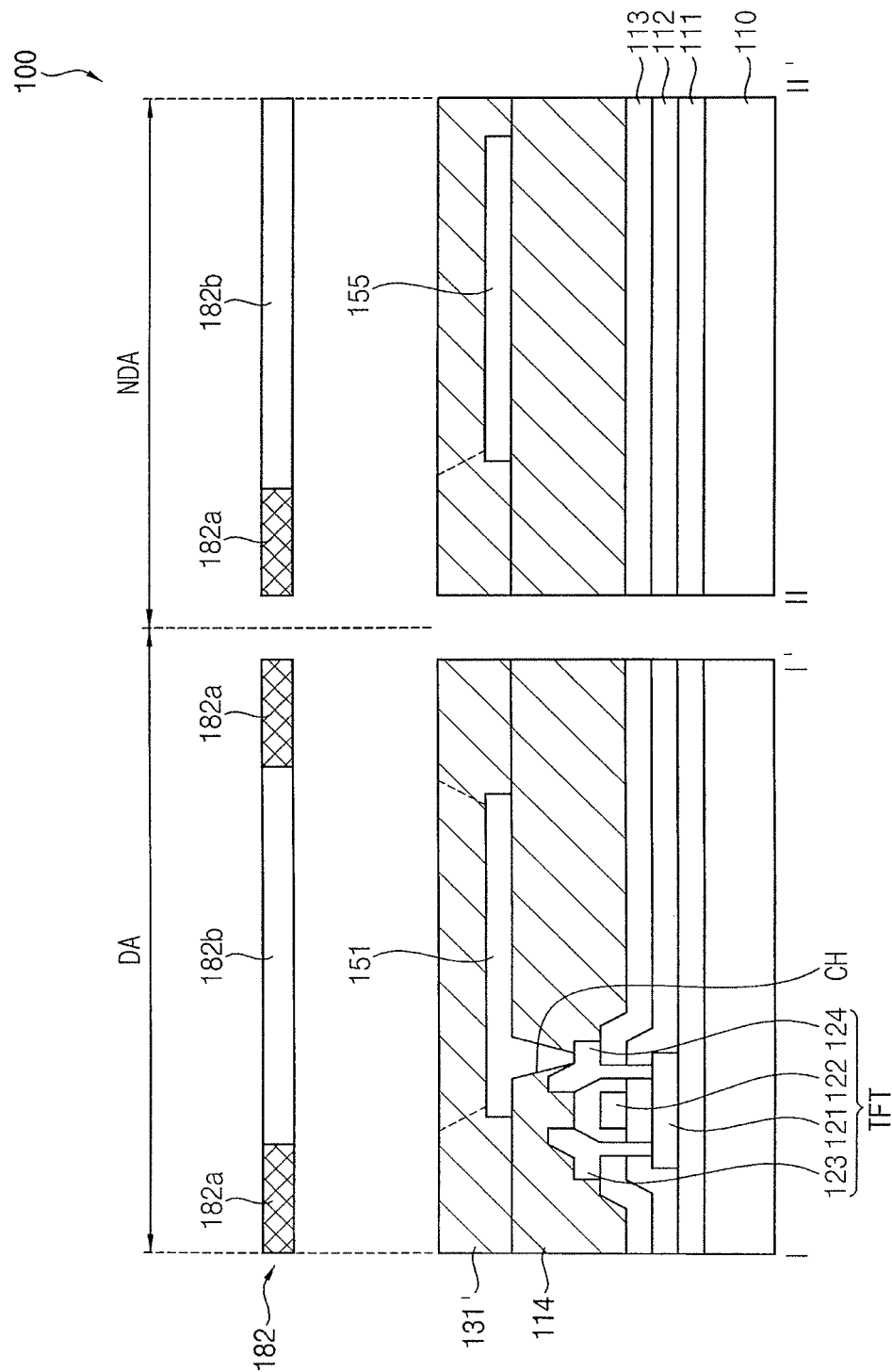
FIGS. 4A, 4B, and 4C illustrate cross-sectional views of stages of another exemplary method of manufacturing the organic light emitting display device in FIG. 2.
Figure 4B:
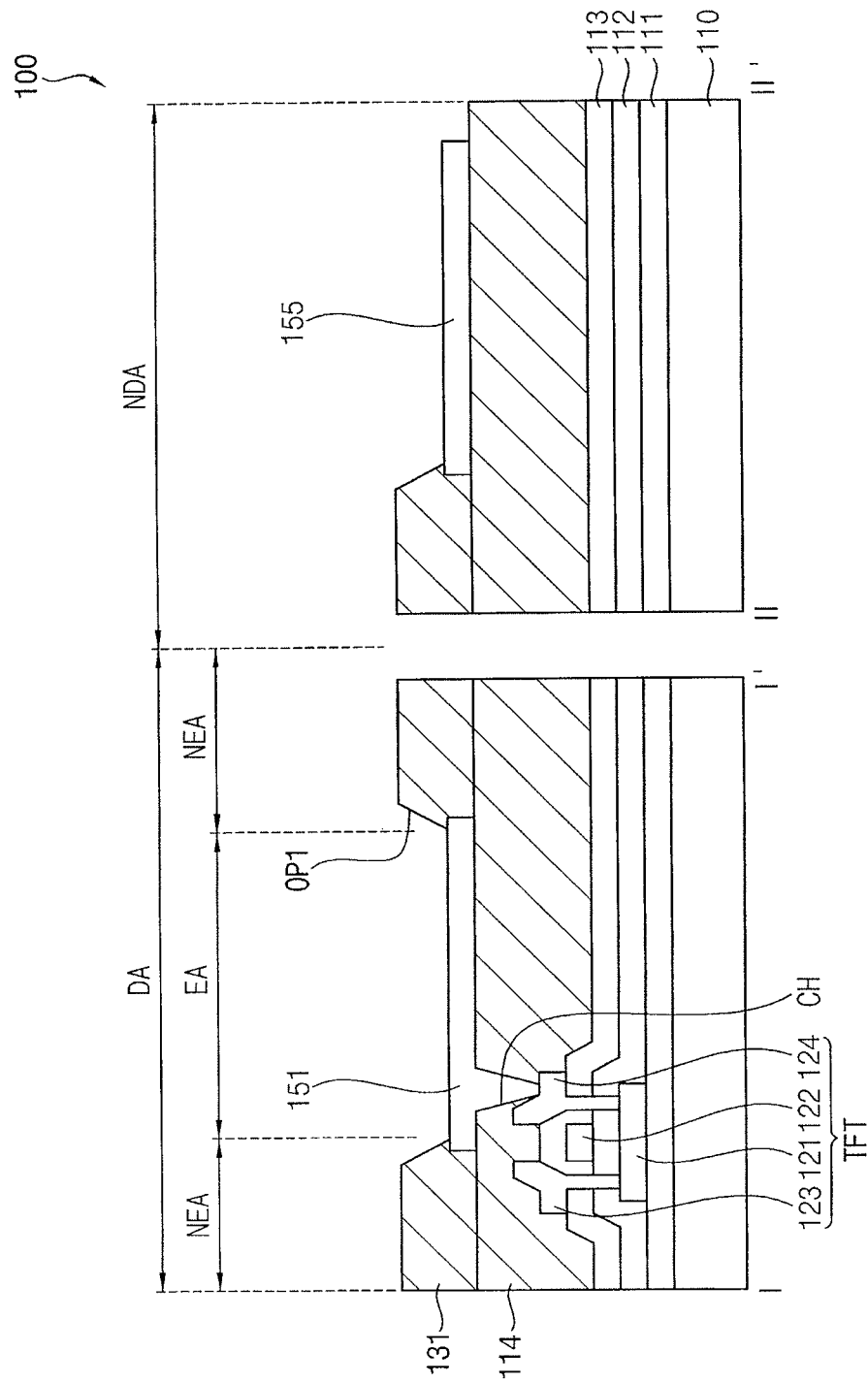
Figure 4C:
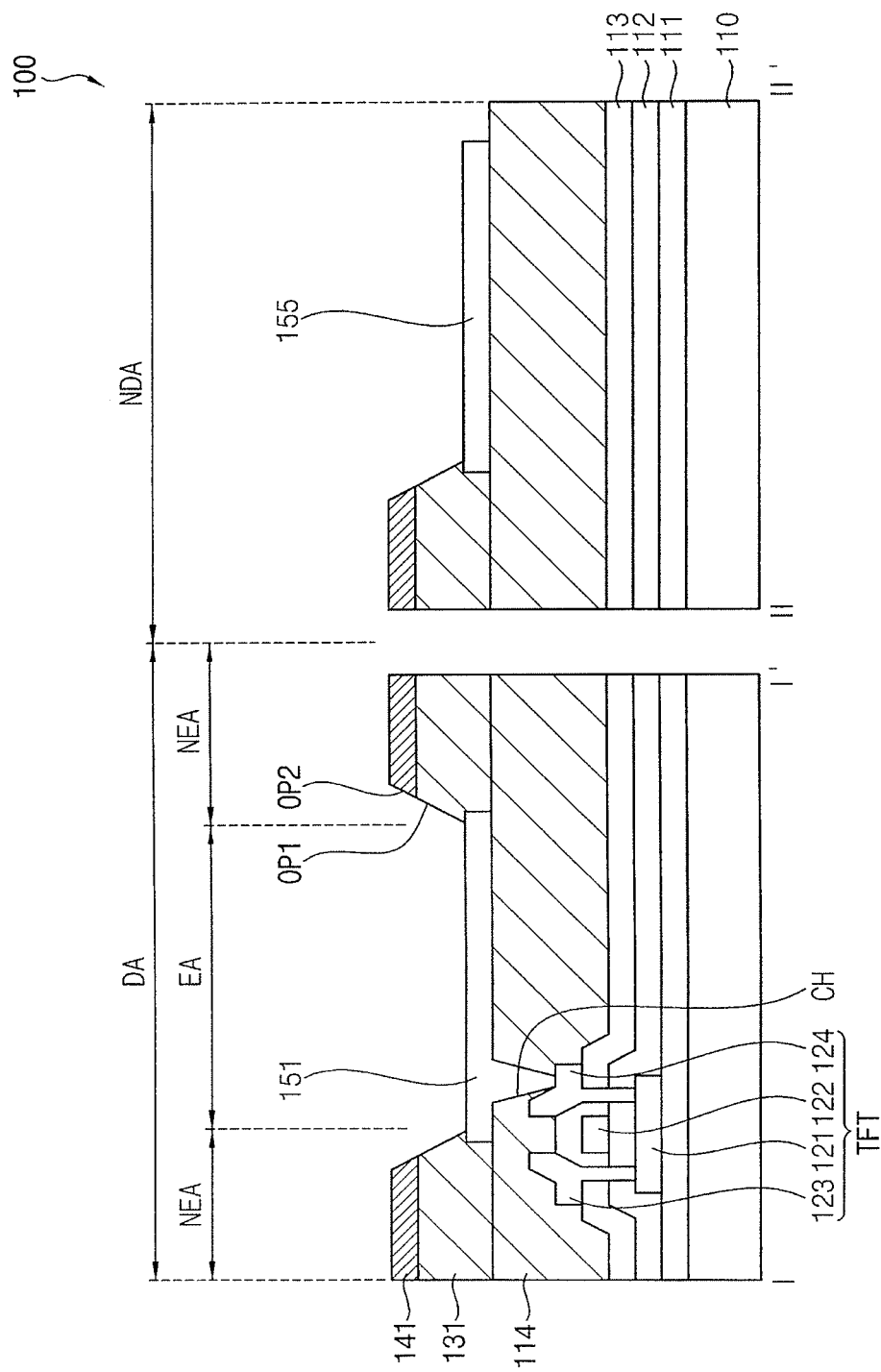

FIGS. 4A, 4B, and 4C illustrate cross-sectional views of stages of another exemplary method of manufacturing the organic light emitting display device in FIG. 2.

Referring to FIG. 4A, a preliminary pixel defining layer 131' covering the first electrode 151 and the peripheral electrode 155 may be formed on the planarization layer 114. The preliminary pixel defining layer 131' may be formed of a photosensitive organic material.

Referring to FIGS. 4A and 4B, an opening may be formed in the preliminary pixel defining layer 131' by photolithography.

First, a mask 182 may be disposed over the preliminary pixel defining layer 131'. The mask 182 may include a light blocking portion 182a and a light transmitting portion 182b. For example, a light transmittance of the light blocking portion 182a may be substantially 0%, and a light transmittance of the light transmitting portion 182b may be substantially 100%. The mask 182 may be disposed such that the light transmitting portion 182b corresponds to the first opening OP1 of the pixel defining layer 131.

Then, light may be irradiated from top of the mask 182 to the preliminary pixel defining layer 131' to form the first opening OP1 in the pixel defining layer 131.

Referring to FIG. 4C, the first light blocking layer 141 may be formed on the pixel defining layer 131. The first light blocking layer 141 may be deposited by printing process such as a nozzle printing, an inkjet printing, or the like. The first light blocking layer 141 may be selectively deposited on the pixel defining layer 131 such that the first light blocking layer 141 includes the second opening OP2 corresponding to the first opening OP1.

Hereinafter, a cross-sectional structure of an organic light emitting display device according to an embodiment will be described with reference to FIG. 5.

Figure 5:
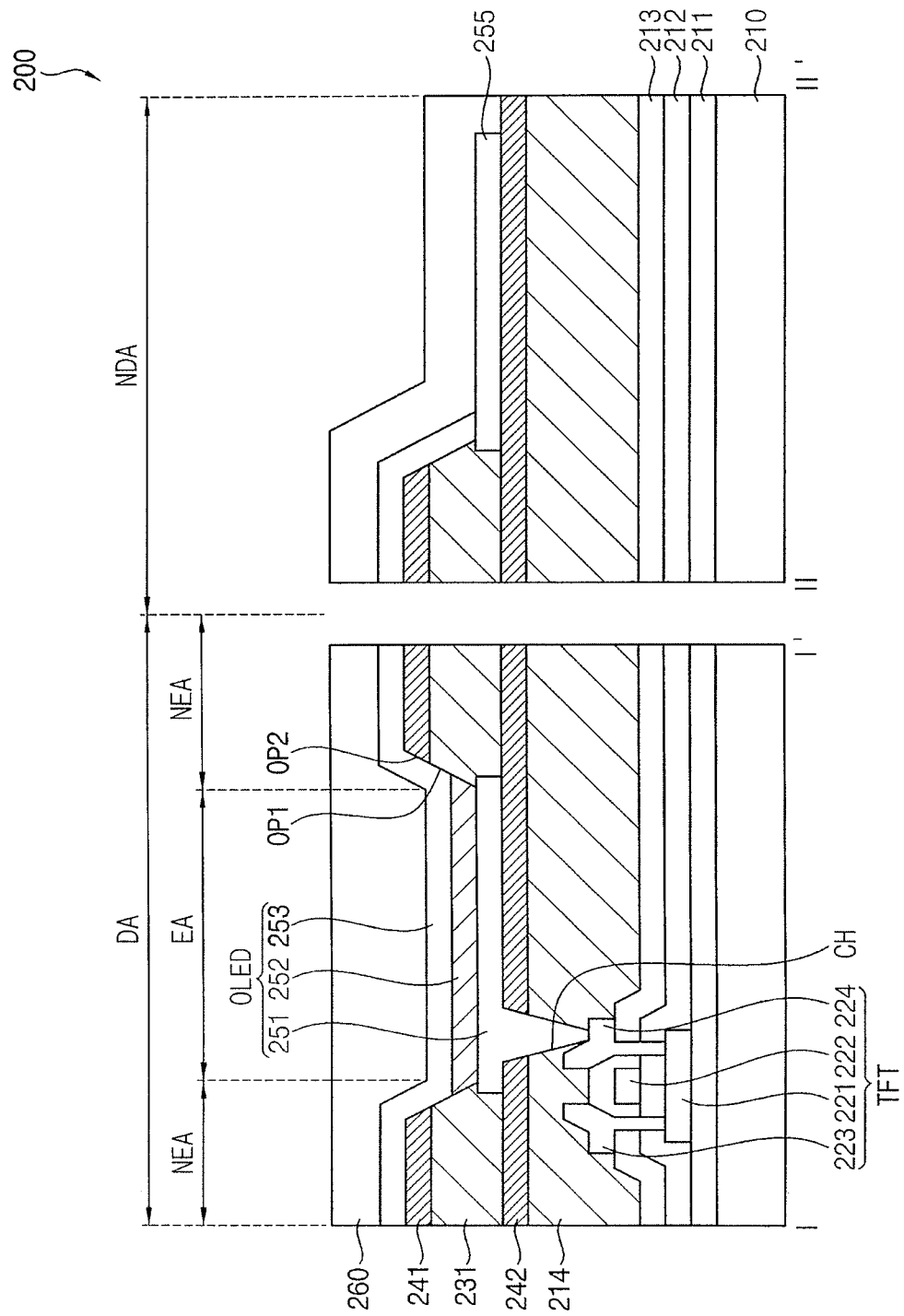
FIG. 5 illustrates a cross-sectional view of an organic light emitting display device according to an embodiment.

FIG. 5 illustrates a cross-sectional view of an organic light emitting display device according to an embodiment. For example, FIG. 5 may be a cross-sectional view taken along a line I-I' and a line II-IF in FIG. 1.

Referring to FIG. 5, an organic light emitting display device 200 according to an embodiment may include a substrate 210, a buffer layer 211, a thin film transistor TFT, a gate insulation layer 212, an insulation interlayer 213, a planarization layer 214, a second light blocking layer 242, an organic light emitting element OLED, a peripheral electrode 255, a pixel defining layer 231, a first light blocking layer 241, and an encapsulation member 260. The thin film transistor TFT may include an active pattern 221, a gate electrode 222, a source electrode 223, and a drain electrode 224. The organic light emitting element OLED may include a first electrode 251, a light emitting layer 252, and a second electrode 253.

Description of elements of the organic light emitting display device 200 according to the embodiment illustrated in FIG. 5 that are substantially the same as or similar to those of the organic light emitting display device 100 according to the embodiment illustrated in FIG. 2 will not be repeated.

The second light blocking layer 242 may be disposed between the planarization layer 214 and the pixel defining layer 231. A color of the second light blocking layer 242 may be reversibly changed by exposure to ultraviolet light.

The second light blocking layer 242 may include a photochromic material. The second light blocking layer 242 may include materials that are substantially the same as those of the first light blocking layer 241.

The organic molecular structure of the photochromic material may be changed depending on whether or not ultraviolet light is absorbed. A color of the photochromic material may be changed depending on the change of the organic molecular structure. Accordingly, a transmittance of the second light blocking layer 242 including the photochromic material may be changed depending on whether or not ultraviolet light is incident thereon. When ultraviolet light is not incident thereon, the second light blocking layer 242 may be transparent. When ultraviolet light is incident thereon, the second light blocking layer 242 may have black color and may be opaque. In other words, the second light blocking layer 242 may become opaque by exposure to ultraviolet light on other areas where ultraviolet light is incident, and the opaque second light blocking layer 242 may prevent the ultraviolet light from being incident on the planarization layer 214.

Hereinafter, a method of manufacturing an organic light emitting display device according to an embodiment will be described with reference to FIGS. 6A and 6B. Description of details of the method of manufacturing the organic light emitting display device with reference to FIGS. 6A and 6B that are substantially the same as or similar to those of the method of manufacturing the organic light emitting display device with reference to FIGS. 2, 3A, and 3B, will not be repeated.

Figure 6A:
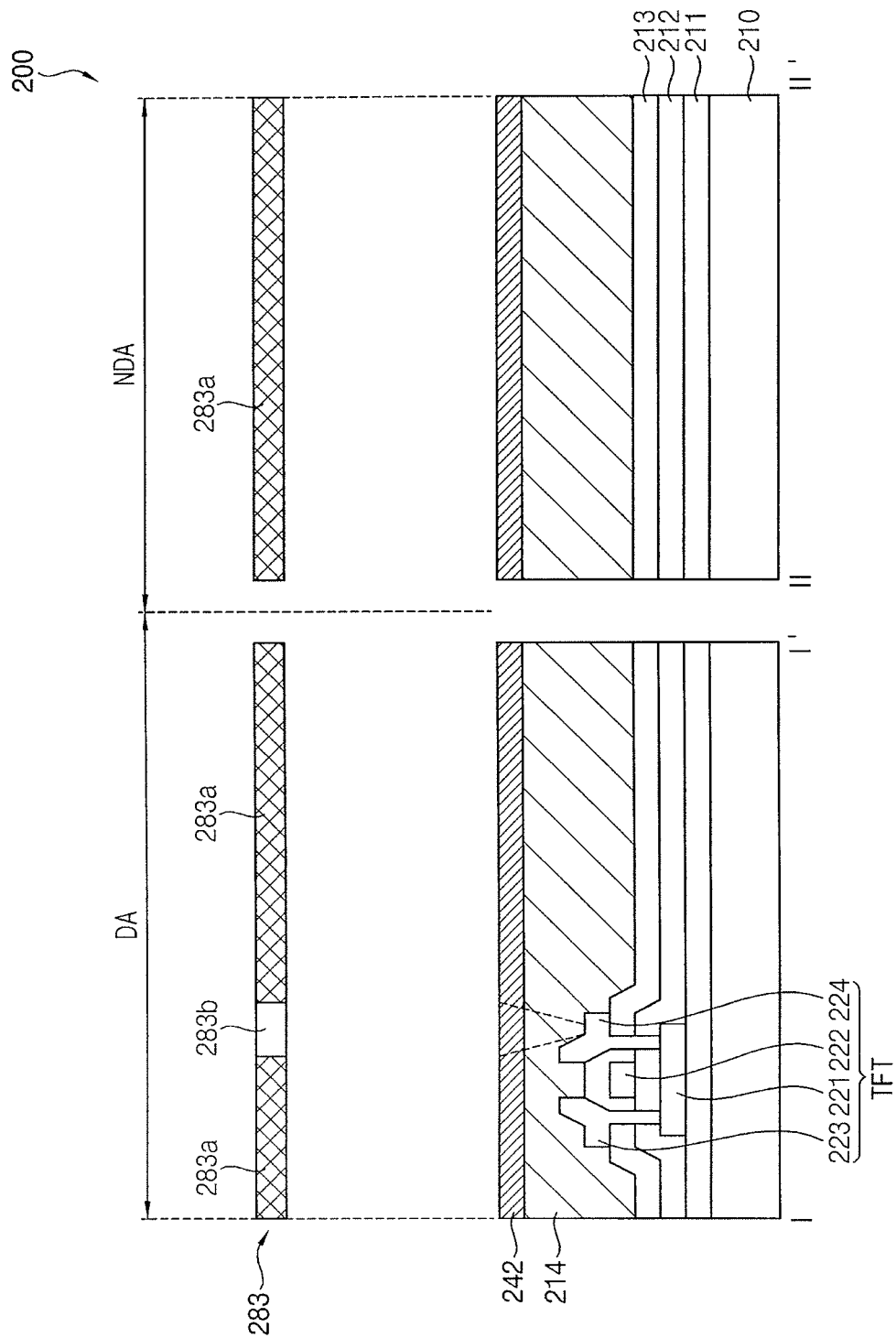
FIGS. 6A and 6B illustrate cross-sectional views of stages of a method of manufacturing the organic light emitting display device in FIG. 5.
Figure 6B:
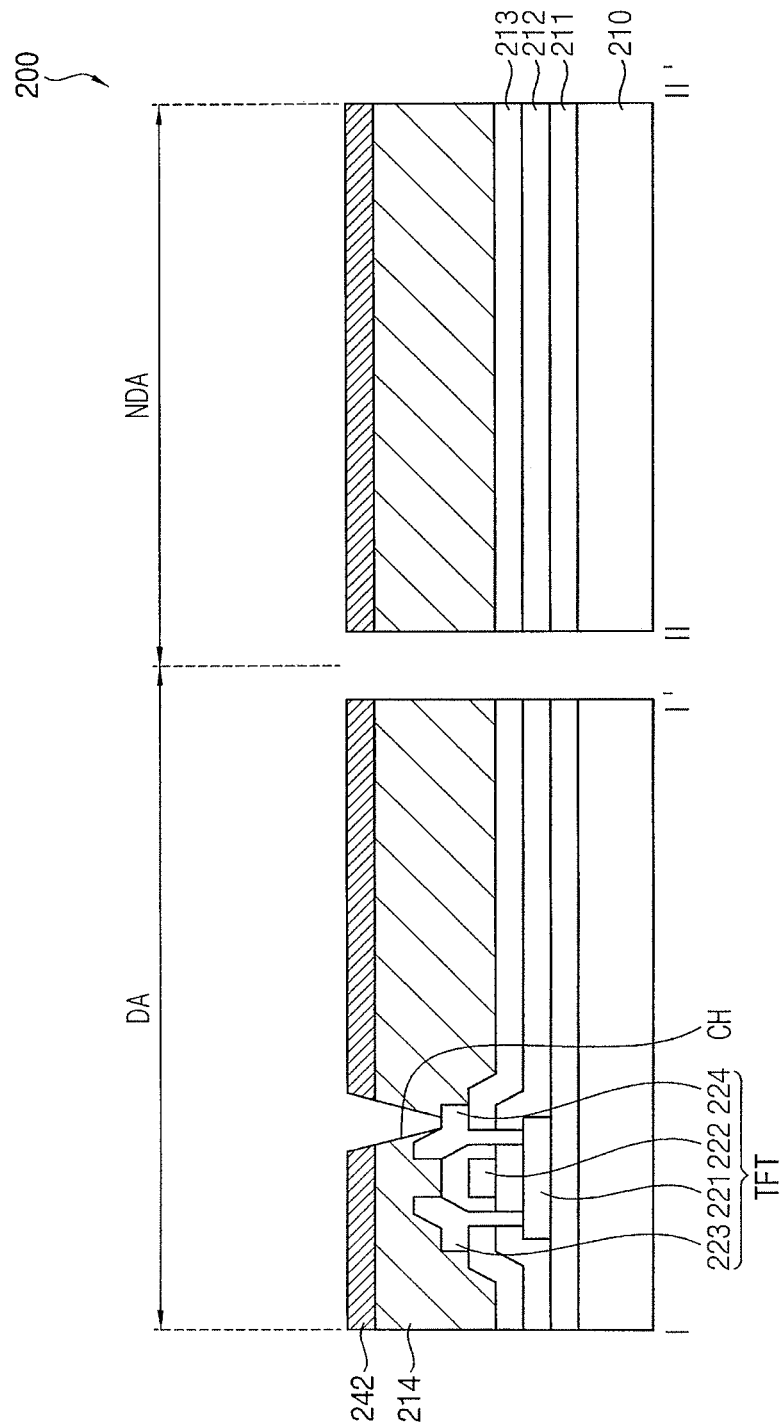

FIGS. 6A and 6B illustrate cross-sectional views depicting stages a method of manufacturing the organic light emitting display device in FIG. 5.

Referring to FIG. 6A, first, the planarization layer 214 covering the source electrode 223 and the drain electrode 224 may be formed on the insulation interlayer 213. The planarization layer 214 may be formed of a photosensitive organic material.

Then, the second light blocking layer 242 may be deposited on the planarization layer 214. The second light blocking layer 242 may be formed of a photosensitive photochromic organic material.

Referring to FIGS. 6A and 6B, a contact hole CH may be formed in the planarization layer 214 and in the second light blocking layer 242 by photolithography.

First, a mask 283 may be disposed over the second light blocking layer 242. The mask 283 may include a light blocking portion 283a and a light transmitting portion 283b. For example, a light transmittance of the light blocking portion 283a may be substantially 0%, and a light transmittance of the light transmitting portion 283b may be substantially 100%. The mask 283 may be disposed such that the light transmitting portion 283b corresponds to the contact hole CH.

Then, light may be irradiated from top of the mask 283 to the second light blocking layer 242 to form the contact hole CH in the planarization layer 214 and in the second light blocking layer 242. The contact hole CH may be formed in the planarization layer 214 and the second light blocking layer 242 by one photolithography process, such that time and cost of manufacturing the display device may be reduced.

Hereinafter, a cross-sectional structure of an organic light emitting display device according to an embodiment will be described with reference to FIG. 7.

Figure 7:
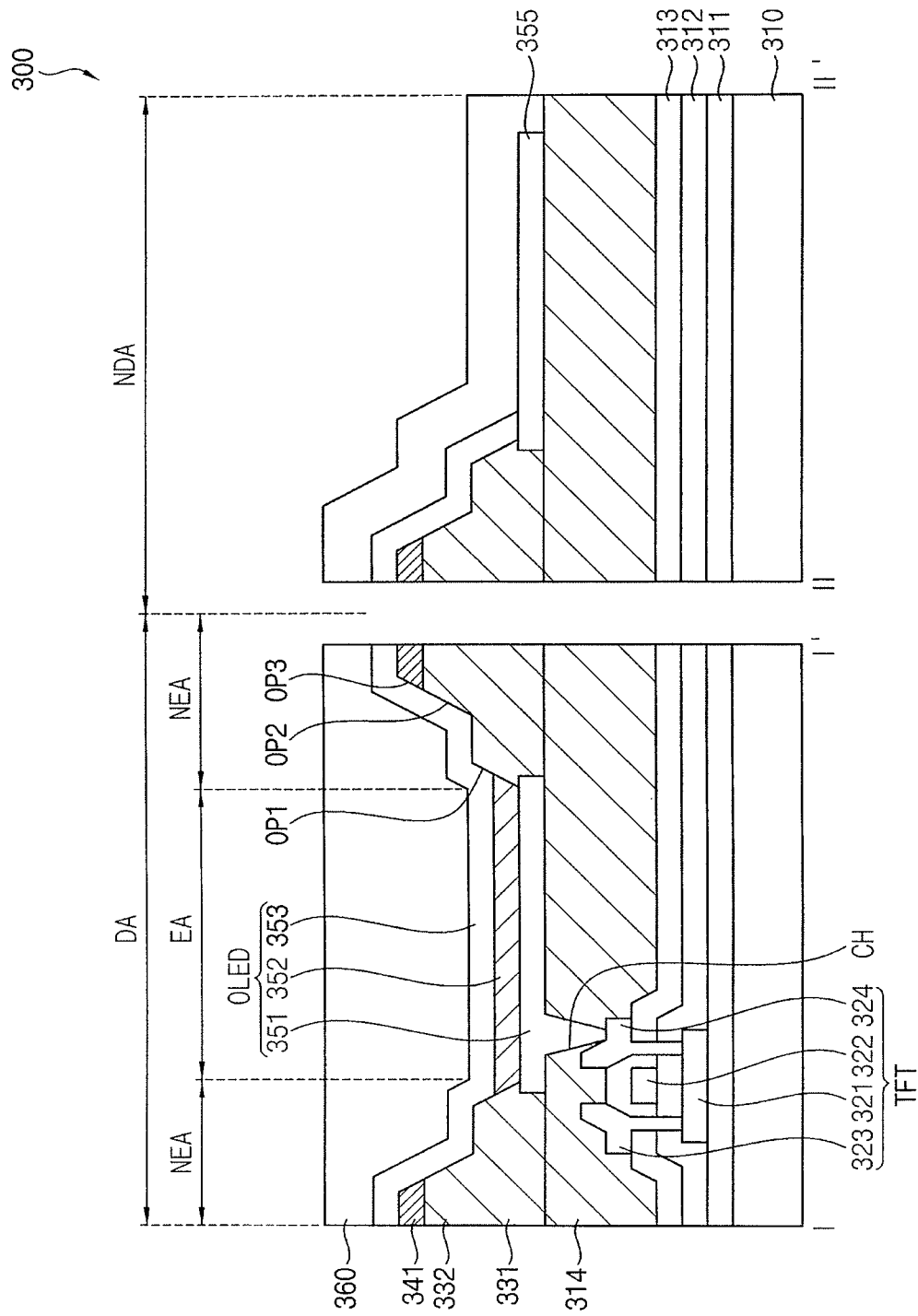
FIG. 7 illustrates a cross-sectional view of an organic light emitting display device according to an embodiment.

FIG. 7 illustrates a cross-sectional view of an organic light emitting display device according to an embodiment. For example, FIG. 7 may be a cross-sectional view taken along a line I-I' and a line II-II' in FIG. 1.

Referring to FIG. 7, an organic light emitting display device 300 according to an embodiment may include a substrate 310, a buffer layer 311, a thin film transistor TFT, a gate insulation layer 312, an insulation interlayer 313, a planarization layer 314, an organic light emitting element OLED, a peripheral electrode 355, a pixel defining layer 331, a spacer 332, a first light blocking layer 341, and an encapsulation member 360. The thin film transistor TFT may include an active pattern 321, a gate electrode 322, a source electrode 323, and a drain electrode 324. The organic light emitting element OLED may include a first electrode 351, a light emitting layer 352, and a second electrode 353.

Description of aspects of the organic light emitting display device 300 according to the embodiment illustrated FIG. 7 that are substantially the same as, or similar to, those of the organic light emitting display device 100 according to an embodiment illustrated in FIG. 2, will not be repeated.

The spacer 332 may be disposed between the pixel defining layer 331 and the first light blocking layer 341. A width of the spacer 332 may be less than a width of the pixel defining layer 331. The spacer 332 may be formed together with the pixel defining layer 331.

The spacer 332 may include a second opening OP2. A width of the second opening OP2 of the spacer 332 may be greater than a width of the first opening OH of the pixel defining layer 331.

The first light blocking layer 341 may include a third opening OP3. The third opening OP3 of the first light blocking layer 341 may correspond to the second opening OP2 of the spacer 332. For example, a width of the third opening OP3 of the first light blocking layer 341 may be substantially equal to a width of the second opening OP2 of the spacer 332. When the first light blocking layer 341 includes the third opening OP3, light emitted from the organic light emitting layer 352 may not be blocked by the first light blocking layer 341.

Hereinafter, a method of manufacturing an organic light emitting display device according to an embodiment will be described with reference to FIGS. 8A and 8B. Description of details of the method of manufacturing the organic light emitting display device illustrated FIGS. 8A and 8B that are substantially the same as or similar to those of the method of manufacturing the organic light emitting display device with reference to FIGS. 2, 3A, and 3B will not be repeated.

Figure 8A:
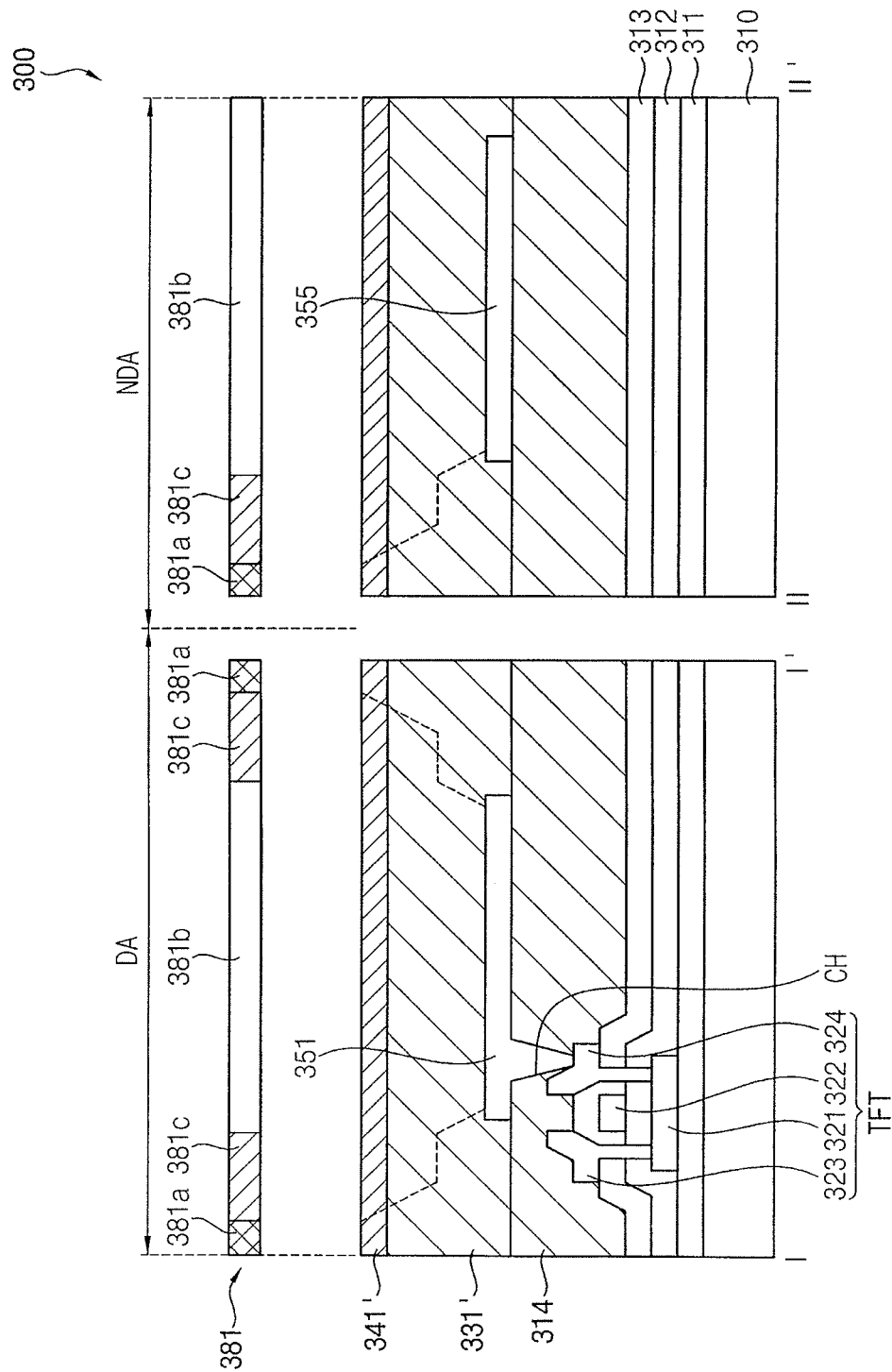
FIGS. 8A and 8B illustrate cross-sectional views of stages of a method of manufacturing the organic light emitting display device in FIG. 7.
Figure 8B:
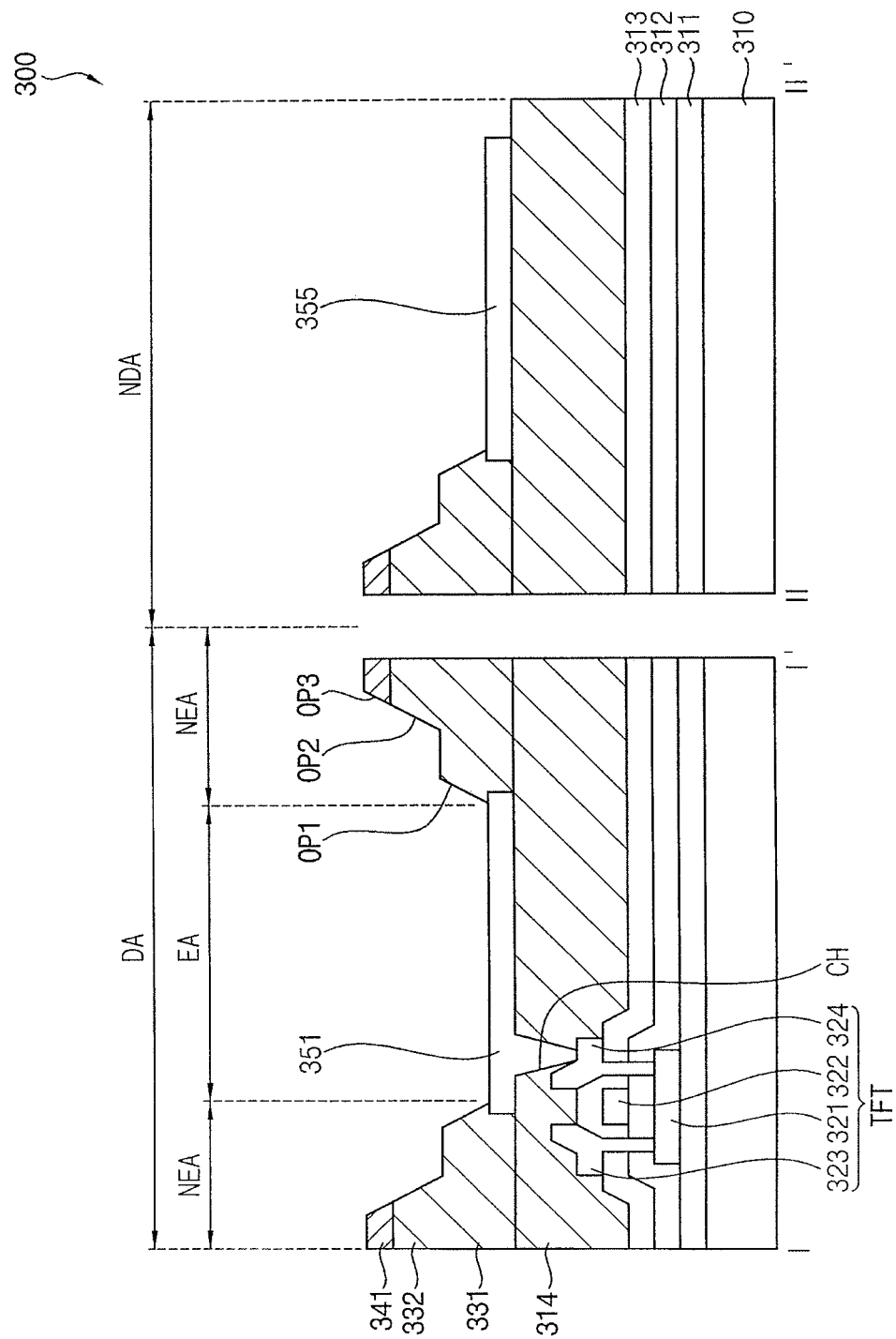

FIGS. 8A and 8B illustrate cross-sectional views depicting stages of a method of manufacturing the organic light emitting display device in FIG. 7.

Referring to FIGS. 8A and 8B, openings may be formed in a preliminary pixel defining layer 331' and in a preliminary first light blocking layer 341' by photolithography.

First, a mask 381 may be disposed over the preliminary first light blocking layer 341'. The mask 381 may include a light blocking portion 381a, a light transmitting portion 381b, and a light semi-transmitting portion 381c. For example, a light transmittance of the light blocking portion 381a may be substantially 0%, a light transmittance of the light transmitting portion 381b may be substantially 100%, and a light transmittance of the light semi-transmitting portion 381c may be from about 0% to about 100%. The mask 381 may be disposed such that the light transmitting portion 381b corresponds to the first opening OP1 of the pixel defining layer 331, and the light transmitting portion 381b and the light semi-transmitting portion 381c corresponds to the second opening OP2 of the spacer 332 and the third opening OP3 of the first light blocking layer 341.

Then, light may be irradiated from top of the mask 381 to the preliminary first light blocking layer 341' to form the first opening OP1 of the pixel defining layer 331, the second opening OP2 of the spacer 332, and the third opening OP3 of the first light blocking layer 341. The first opening OP1, the second opening OP2, and the third opening OP3 may be substantially simultaneously formed. The first opening OP1, the second opening OP2, and the third opening OP3 may be simultaneously formed by one photolithography process, so that time and cost of manufacturing the display device may be reduced.

The organic light emitting display device according to embodiments may be applied to a display device included in a computer, a notebook, a mobile phone, a smartphone, a smart pad, a PMP, a PDA, an MP3 player, or the like.

By way of summation and review, when an intensity of external light is strong, the external light may be reflected by an organic light emitting display device, and the image displayed by the organic light emitting display device may not be clearly observed. To prevent the reflection of the external light, a polarizer, a black matrix, etc. may be disposed in the organic light emitting display device. However, such components may increase the thickness of the organic light emitting display device.

Further, when external light is incident onto the organic light emitting display device, outgas may be emitted from an organic insulation layer of the organic light emitting display device due to reactions promoted by the external light, and pixels of the organic light emitting display device may be degraded due to effects of the outgas.

Embodiments provide an organic light emitting display device including a light blocking layer. The light blocking layer may be disposed on the pixel defining layer and may include photochromic material. A color of the light blocking layer may be reversibly changeable by exposure to ultraviolet light. Therefore, visibility in an outdoor environment may be improved and external light that induces outgassing from the pixel defining layer may be blocked.

Embodiments provide a method of manufacturing an organic light emitting display device. In the method of manufacturing the organic light emitting display device according to the embodiments, the pixel defining layer and the light blocking layer may be substantially simultaneously formed. Accordingly, the time and cost of manufacturing the organic light emitting display device may be reduced Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light emitting display device, comprising:
   a substrate including a display area and a non-display area;
   a thin film transistor on the substrate in the display area;
   a planarization layer covering the thin film transistor;
   a first electrode on the planarization layer in the display area, the first electrode being connected to the thin film transistor;
   a pixel defining layer covering the first electrode, the pixel defining layer including a first opening that exposes a portion of the first electrode to define an emission area;
   a first light blocking layer on the pixel defining layer, the first light blocking layer including a photochromic material, a color of the first light blocking layer being reversibly changeable upon exposure to ultraviolet light and the first light blocking layer including a second opening corresponding to the first opening;
   an organic light emitting layer on the first electrode; and
   a second electrode on the organic light emitting layer.

2. The organic light emitting display device as claimed in claim 1, wherein the pixel defining layer and the first light blocking layer are located over the substrate in both the display area and the non-display area.

3. The organic light emitting display device as claimed in claim 1, wherein the photochromic material includes at least one of spiropyran, a spironaphthoxazine dye, a diarylethene derivative, dihydropyridine, a furyl fulgide derivative, and an azobenzene derivative.

4. The organic light emitting display device as claimed in claim 1, wherein the first light blocking layer becomes opaque upon exposure to ultraviolet light.

5. The organic light emitting display device as claimed in claim 1, further comprising:
an encapsulation member on the second electrode.

6. The organic light emitting display device as claimed in claim 1, further comprising:
a second light blocking layer between the planarization layer and the pixel defining layer, a color of the second light blocking layer being reversibly changeable upon exposure to ultraviolet light.

7. The organic light emitting display device as claimed in claim 6, wherein the second light blocking layer includes a same material as the first light blocking layer.

8. The organic light emitting display device as claimed in claim 6, wherein the second light blocking layer becomes opaque upon exposure to ultraviolet light.

9. An organic light emitting display device, comprising:
a substrate including a display area and a non-display area;
a thin film transistor on the substrate in the display area;
a planarization layer covering the thin film transistor;
a first electrode on the planarization layer in the display area, the first electrode being connected to the thin film transistor;
a pixel defining layer covering the first electrode, the pixel defining layer including a first opening that exposes a portion of the first electrode to define an emission area;
a spacer on the pixel defining layer, the spacer including a second opening that has a width greater than a width of the first opening;
a first light blocking layer on the spacer, the first light blocking layer including a photochromic material, a color of the first light blocking layer being reversibly changeable upon exposure to ultraviolet light;
an organic light emitting layer on the first electrode; and
a second electrode on the organic light emitting layer.

10. The organic light emitting display device as claimed in claim 9, wherein the first light blocking layer includes a third opening corresponding to the second opening.

11. A method of manufacturing an organic light emitting display device, the method comprising:
preparing a substrate including a display area and a non-display area;
forming a thin film transistor on the substrate in the display area;
forming a planarization layer covering the thin film transistor on the substrate;
forming a first electrode connected to the thin film transistor on the planarization layer in the display area;
forming a pixel defining layer covering the first electrode and including a first opening that exposes a portion of the first electrode to define an emission area on the planarization layer;
forming a spacer on the pixel defining layer, the spacer having a width less than a width of the pixel defining layer;
forming a first light blocking layer such that the spacer is between the pixel defining layer and the first light blocking layer, the first light blocking layer including a photochromic material on the pixel defining layer, a color of the first light blocking layer being reversibly changeable upon exposure to ultraviolet light;
forming an organic light emitting layer on the first electrode; and
forming a second electrode on the organic light emitting layer.

12. The method as claimed in claim 11, wherein the pixel defining layer and the first light blocking layer are formed over the substrate in both the display area and the non-display area.

13. The method as claimed in claim 11, wherein forming the pixel defining layer and forming the first light blocking layer include:
sequentially forming a preliminary pixel defining layer and a preliminary first light blocking layer covering the first electrode on the planarization layer; and
simultaneously forming the first opening of the pixel defining layer and a second opening of the first light blocking layer corresponding to the first opening by photolithography.

14. The method as claimed in claim 11, wherein forming the pixel defining layer includes:
forming a preliminary pixel defining layer covering the first electrode on the planarization layer; and
forming the first opening of the pixel defining layer by photolithography,
wherein forming the first light blocking layer includes forming the first light blocking layer to include a second opening corresponding to the first opening.

15. The method as claimed in claim 11, further comprising:
forming a second light blocking layer between the planarization layer and the pixel defining layer, a color of the second light blocking layer being reversibly changeable upon exposure to ultraviolet light.

16. The method as claimed in claim 15, wherein forming the planarization layer and forming the second light blocking layer include:
sequentially forming the planarization layer and the second light blocking layer to cover the thin film transistor on the substrate; and
forming a contact hole exposing a portion of the thin film transistor in the planarization layer and in the second light blocking layer by photolithography.

17. The method as claimed in claim 11, further comprising:
forming an encapsulation member on the second electrode.

18. The method as claimed in claim 11, wherein forming the pixel defining layer, forming the spacer, and forming the first light blocking layer include:
sequentially forming a preliminary pixel defining layer and a preliminary first light blocking layer covering the first electrode on the planarization layer; and
simultaneously forming the first opening of the pixel defining layer, a second opening of the spacer, and a third opening of the first light blocking layer by photolithography, the second opening having a width greater than that of the first opening, and the third opening corresponding to the second opening.

* * * * *